United States Patent
Nilsson et al.

(10) Patent No.: US 8,041,310 B2
(45) Date of Patent: Oct. 18, 2011

(54) APPARATUS AND METHODS FOR FREQUENCY CONTROL IN A MULTI-OUTPUT FREQUENCY SYNTHESIZER

(75) Inventors: Magnus Nilsson, Lund (SE); Nikolaus Klemmer, Cary, NC (US); John S. Petty, Jr., Chapel Hill, NC (US); Satish Uppathil, Morrisville, NC (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 856 days.

(21) Appl. No.: 11/865,376

(22) Filed: Oct. 1, 2007

(65) Prior Publication Data

US 2009/0088085 A1    Apr. 2, 2009

(51) Int. Cl.
*H04B 1/40* (2006.01)
(52) U.S. Cl. .................................. 455/76; 455/456.1
(58) Field of Classification Search .............. 455/76, 455/192.1, 192.2, 260, 264, 265; 331/1, 331/25, 34; 377/28
See application file for complete search history.

(56) References Cited

U.S. PATENT DOCUMENTS

| | | | | |
|---|---|---|---|---|
| 5,132,633 A | * | 7/1992 | Wong et al. | 327/113 |
| 5,313,346 A | * | 5/1994 | Shimotashiro et al. | 360/77.13 |
| 5,572,167 A | * | 11/1996 | Alder et al. | 331/2 |
| 6,236,703 B1 | | 5/2001 | Riley | |
| 6,856,791 B2 | | 2/2005 | Klemmer | |
| 6,867,734 B2 | | 3/2005 | Voor et al. | |
| 2003/0176173 A1 | * | 9/2003 | Klemmer | 455/182.2 |
| 2003/0214432 A1 | | 11/2003 | Tawadrous et al. | |
| 2003/0214436 A1 | | 11/2003 | Voor et al. | |
| 2003/0219082 A1 | * | 11/2003 | Tanaka et al. | 375/324 |
| 2005/0078743 A1 | * | 4/2005 | Shohara | 375/219 |
| 2006/0215778 A1 | | 9/2006 | Murthy et al. | |
| 2009/0258657 A1 | * | 10/2009 | Tanaka et al. | 455/456.1 |

FOREIGN PATENT DOCUMENTS

| | | |
|---|---|---|
| EP | 1206039 A2 | 5/2002 |
| WO | 03/098258 A1 | 11/2003 |
| WO | 20061031672 | 3/2006 |
| WO | 2008/021810 A2 | 2/2008 |

* cited by examiner

*Primary Examiner* — Edward Urban
*Assistant Examiner* — Ganiyu Hanidu
(74) *Attorney, Agent, or Firm* — Coates & Bennett, P.L.L.C.

(57) ABSTRACT

Methods and circuits for synthesizing two or more signals phase-locked to a common reference frequency signal are disclosed. In one embodiment, a method comprises generating first and second output signals phase-locked to a reference clock signal, using first and second phase-locked loop circuits. In response to a detected frequency error in the first output signal, the first output signal is corrected by adjusting a frequency-division ratio in the first phase-locked loop circuit. The second output signal is corrected, separately from the correction to the first output signal, by adjusting a frequency-division ratio in the second phase-locked loop circuit, using an adjustment parameter calculated from the detected frequency error. In another exemplary method, first and second output signals are generated as described above, using first and second phase-locked loop circuits. The first output signal is corrected by adjusting a frequency-division ratio in the first phase-locked loop circuit and generating a control signal to adjust the frequency of the reference clock signal, in response to detected frequency error in the first output signal. Because the second output signal is derived from the common reference clock signal, adjustments to the reference clock frequency will also adjust the frequency of the second output signal. Additional adjustments to the second output signal may be applied in some embodiments by adjusting a frequency-division ratio in the second phase-locked loop circuits. Circuits for implementing the described methods are also disclosed.

25 Claims, 5 Drawing Sheets

APPARATUS AND METHODS FOR FREQUENCY CONTROL IN A MULTI-OUTPUT FREQUENCY SYNTHESIZER

BACKGROUND

Technical Field

The present invention generally relates to the field of communications, and more particularly relates to techniques for generating and controlling precision frequency sources in cellular telephones or other communications devices.

Background

Modern communications devices, whether communicating via a wire or wirelessly, typically require at least one clock operating at a relatively stable reference frequency. With increased integration, devices such as cellular phones now commonly include additional communication functions such as wireless local-area network (W-LAN) transceivers, Bluetooth radios, Global Positioning System (GPS) receivers, Universal Serial Bus (USB) interfaces, and so on. In addition, cellular standards are becoming more complex, with a trend towards the simultaneous use of multiple communications channels, each of which may use a different operating frequency.

Each communication block needs one or more clock frequencies, whether for clocking baseband circuitry or digital signal processors, or for use as local oscillators in radio circuitry. The exact operating frequencies required for each block may vary, and the accuracy requirements may also vary from one function to the next. For instance, a cellular phone typically must have local oscillators that are accurate to about 0.1 parts-per-million (ppm) with respect to a reference at the base station receiving the phone's transmissions. Since Doppler shift caused by a phone's motion relative to the base station can cause an apparent frequency shift of up to 0.5 ppm, this accuracy is typically achieved through the use of well-known Automatic Frequency Control (AFC) techniques. A GPS receiver, on the other hand, will work quite well with frequency accuracies on the order of 0.5 ppm, or even 2 or 3 ppm, but may require that its frequency reference be stable to within 2 parts-per-billion (ppb) for the duration of a measurement interval for best performance. In contrast, a Bluetooth radio may only require reference frequency accuracies on the order of 20 ppm.

To minimize costs, devices may share a reference clock. For instance, U.S. Pat. No. 6,867,734 to Voor et al. describes a communications device combining a cellular transceiver and a GPS receiver, in which a shared reference clock is used to synthesize a local oscillator signal for the communications transceiver and a high-frequency clock signal for the GPS receiver. However, sharing a reference clock can cause several problems.

First, if AFC is used to adjust the reference clock frequency so that, for example, a cellular transceiver local oscillator (LO) tracks the frequency of a received base station signal, then changes in the reference clock frequency are reflected in other circuits sharing the reference. A temporary loss of the received signal, such as may occur when driving through a tunnel, may cause unexpected variations in the reference clock frequency due to the AFC loop's response to the loss of signal. These variations may impair performance in other circuits sharing the reference. Changes to the reference frequency due to tracking Doppler errors will also be passed through to other circuits sharing the reference clock, again causing possible performance impairments. Furthermore, AFC corrections to the reference clock frequency, even if relatively small, may disrupt performance in applications that require clock stability during a critical interval.

In view of the foregoing, disclosed herein are methods and apparatus for generating, from a single reference clock signal, two or more clock signals for separate applications in a communications device.

SUMMARY

The teachings presented herein provide methods and circuits for synthesizing two or more signals phase-locked to a common reference frequency signal. In several embodiments, a method comprises generating first and second output signals phase-locked to a reference clock signal, using first and second phase-locked loop circuits. In response to a detected frequency error in the first output signal, the first output signal is corrected by adjusting a frequency-division ratio in the first phase-locked loop circuit. The second output signal is corrected, separately from the correction to the first output signal, by adjusting a frequency-division ratio in the second phase-locked loop circuit, using an adjustment parameter calculated from the detected frequency error.

In another exemplary method, first and second output signals are generated as described above, using first and second phase-locked loop circuits. The first output signal is corrected by adjusting a frequency-division ratio in the first phase-locked loop circuit and generating a control signal to adjust the frequency of the reference clock signal, in response to detected frequency error in the first output signal. Because the second output signal is derived from the common reference clock signal, adjustments to the reference clock frequency will also adjust the frequency of the second output signal. Additional adjustments to the second output signal may be applied in some embodiments by adjusting a frequency-division ratio in the second phase-locked loop circuits.

A frequency synthesizer circuit according to one or more embodiments of the present invention comprises first and second phase-locked loop circuits configured to generate first and second output signals, respectively, each output signal phase-locked to a common reference clock signal. The frequency synthesizer circuit further comprises a frequency correction circuit configured to correct the first output signal by adjusting a first frequency-division ratio in the first phase-locked loop circuit, in response to a detected frequency error in the first output signal. The frequency correction circuit is further configured to calculate an adjustment parameter, based on the detected frequency error, and to correct the second output signal by adjusting a second frequency-division ratio in the second phase-locked loop circuit, using the adjustment parameter.

In several embodiments, the frequency correction circuit is configured to calculate the adjustment parameter based on an offset, so that the first and second output signal frequencies are corrected in different proportions. In one or more embodiments, the frequency correction circuit is configured to schedule the adjustments applied to any or all of the first or second frequency-division ratios or to the reference clock, to avoid frequency discontinuities in the first or second output signals, or both, during one or more application-dependent time intervals.

An exemplary communications device is also disclosed, comprising a communications transceiver circuit, a second receiver circuit, a first and second phase-locked loop circuits configured to generate first and second output signals, respectively, phase-locked to a common reference clock signal, and a frequency correction circuit. The first output signal is used by the communications transceiver circuit and the second output signal is used by the second receiver circuit. The frequency correction circuit is configured to correct the first output signal by adjusting a first frequency-division ratio in the first phase-locked loop circuit and generating a control signal to adjust the frequency of the reference clock signal, in response to a frequency error in the first output signal detected by the communications transceiver circuit. In some embodiments, the frequency correction circuit may be further configured to calculate an adjustment parameter based on the detected frequency error and the adjustment to the reference clock frequency, and to correct the second output signal by adjusting a second frequency-division ratio in the second phase-locked loop circuit, using the adjustment parameter.

In several embodiments, the second receiver may comprise a positioning satellite receiver circuit, such as a GPS receiver circuit, and the frequency correction circuit is configured to schedule adjustments to avoid frequency discontinuities during one or more satellite signal measurements made by the satellite positioning receiver circuit.

Of course, the present invention is not limited to the above features and advantages. Indeed, those skilled in the art will recognize additional features and advantages upon reading the following detailed description, and upon viewing the accompanying drawings.

DETAILED DESCRIPTION

The following description describes an exemplary cellular phone to illustrate various aspects of the present invention. However, those skilled in the art will appreciate that the described techniques may be applied to any device supporting a communications mode that uses some form of automatic frequency control (AFC) in addition to one or more other radio or communications mode that may or may not also use AFC. For instance, the methods and circuits described herein may be employed in television receivers, broadcast radio receivers, cordless phones or the like, when any of those devices are integrated with other communication blocks. Accordingly, the claimed invention is by no means limited to cellular phone applications.

Figure 1:
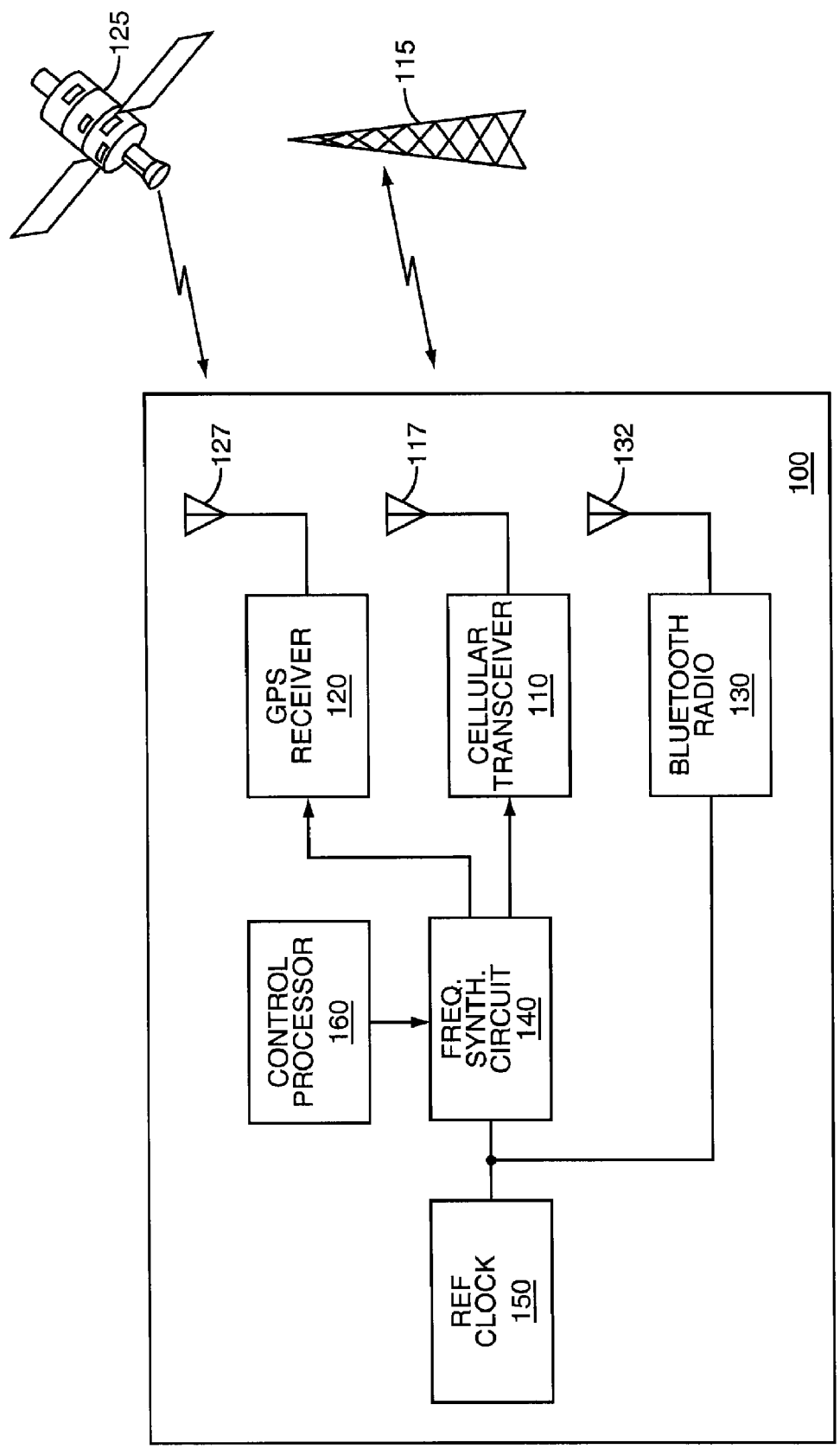
FIG. 1 is a block diagram of one embodiment of a communications device communicating with a cellular base station and receiving positioning satellite signals.

FIG. 1 illustrates a cellular phone 100 including a cellular transceiver 110, communicating with cellular base station 115 via cellular antenna 117, and a GPS receiver 120, receiving positioning signals from one or more positioning satellites 125 via antenna 127. Cellular phone 100 also includes a Bluetooth radio 130, which may communicate with other Bluetooth-equipped devices via Bluetooth antenna 132.

Cellular phone 100 also includes a frequency synthesizer circuit 140, driven by a reference clock signal from reference clock 150, that supplies one or more clock signals for each of cellular transceiver 110 and GPS receiver 120. Each of these supplied clock signals may be a local oscillator (LO) signal for direct use in an upconverter or downconverter circuit, or may be an intermediate signal from which LO and/or digital clocking signals may be derived. In the pictured embodiment, Bluetooth radio 130 uses the reference clock signal from reference clock 150 directly. In others, Bluetooth radio 130 might be supplied with another clock signal generated by frequency synthesizer circuit 140. Control processor 160 controls frequency synthesizer circuit 140 as well as GPS receiver 120, cellular transceiver 110, and Bluetooth radio 130.

Figure 2:
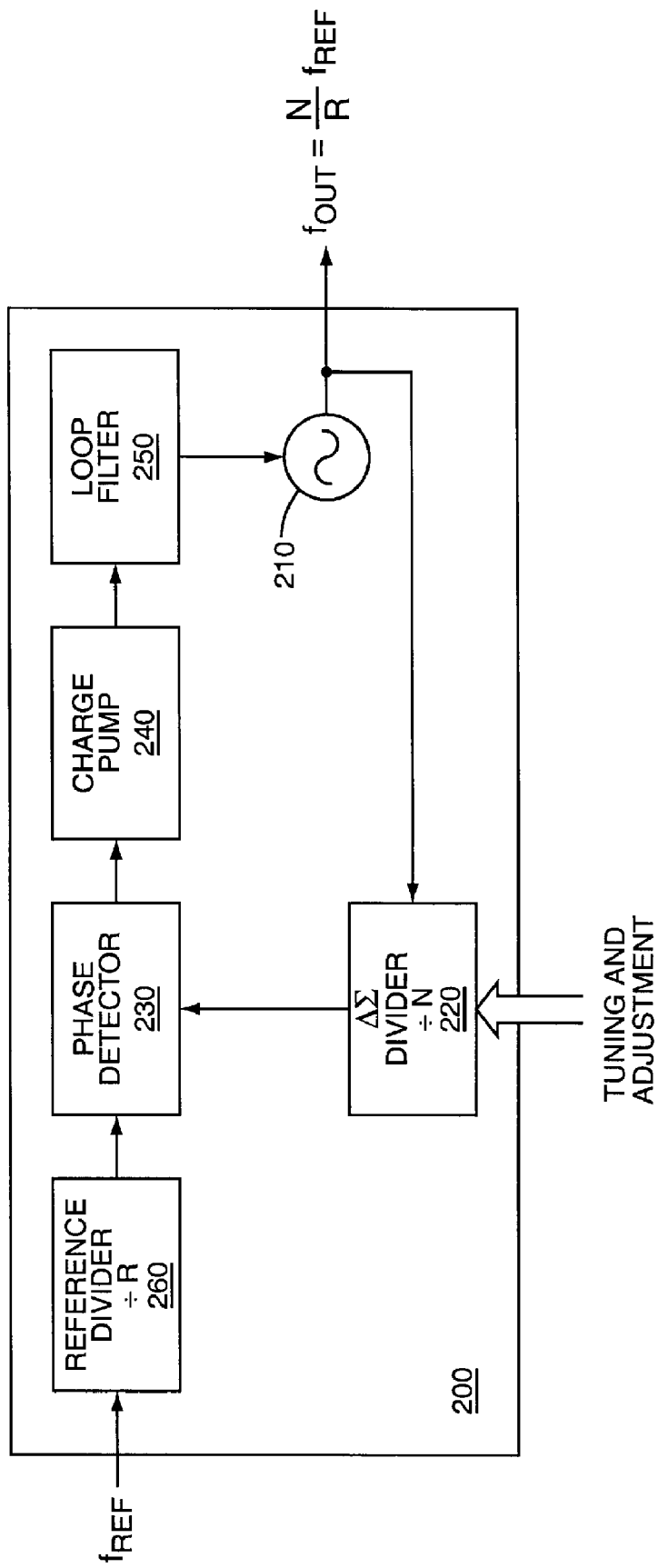
FIG. 2 is a block diagram of a phase-locked loop circuit.

FIG. 2 illustrates a phase-locked loop (PLL) circuit 200 that may be used in frequency synthesizer circuit 140 to generate an output signal phase-locked to the reference clock signal. PLL circuit 200 comprises an oscillator 210, a delta-sigma (ΔΣ) frequency divider 220, phase detector 230, charge pump 240, loop filter 250, and reference divider 260. The operation of PLLs is well known in the art, and will only be discussed briefly herein. In general terms, the output signal produced by oscillator 210, at a frequency of $f_{OUT}$, is fed back to ΔΣ divider 220, which produces a signal with a frequency of $$\frac{f_{OUT}}{N}.$$

As will be discussed in more detail below, the ΔΣ divider 220 permits high-resolution, non-integer, frequency-division ratios to be used. The output of ΔΣ divider 220 is supplied to phase detector 230, where it is compared with a reference signal. The reference signal in FIG. 2 is obtained by dividing the reference clock signal (at a frequency of $f_{REF}$), using reference divider 260, which has a frequency-division ratio of R. (Dividing the reference frequency is optional, as those skilled in the art will recognize; if the reference frequency is not divided, then R=1 for the purposes of this analysis.) Phase detector 230 compares the relative phases of the divided output signal and the divided reference signal and generates a signal, using charge pump 240, that drives loop filter 250 and the oscillator 210. The loop filter effectively integrates the correction signals generated by the phase detector 230 and charge pump 240 to produce a control signal that drives the oscillator 210 to an output frequency (and phase) so that the compared signals at phase detector 230 have a constant (usually zero) phase difference. The signals at the phase detector 230 input are thus driven to an identical frequency, so that the frequency of the output signal from oscillator 210 stabilizes at $$f_{OUT} = \frac{N}{R} f_{REF}.$$

PLL circuit 200 is one example of a fractional-N frequency synthesizer. In general, fractional-N synthesizers exploit the fact that rapid changes in the feedback division ratio N can be averaged by the lowpass closed-loop response of the PLL circuit 200. For example, over a duration of ten reference signal cycles, if the division ratio is integer $N_1$ for seven cycles and integer $N_2$ for the remaining three cycles, the average ratio is $$\frac{7N_1 + 3N_2}{10}.$$

Those skilled in the art will appreciate that the effective division ratio is not limited to integers. For instance, if $N_2=N_1+1$, then for the preceding example the effective division ratio is ($N_1+0.3$). Fractional-N synthesizers have been used for decades to obtain smaller tuning step sizes (or, equivalently, to allow the use of higher reference frequencies), but have historically suffered from spurious tones in the output signal that are difficult to suppress. However, more recently, all-digital methods for implementing the timing sequences of changes to the instantaneous feedback division ratio, including the use of a ΔΣ divider 220 as shown in FIG. 2, have been developed to minimize the impact of spurious response while gaining the flexibility of divide ratios that may be changed in nearly arbitrarily small step sizes.

Because an appropriately designed fractional-N synthesizer permits very small tuning steps, small adjustments or corrections of the output frequency may be applied by adjusting the frequency-division ratio N. As a result, automatic frequency control (AFC), which has conventionally been performed by adjusting a reference clock frequency, can be implemented instead by applying adjustments to the frequency-division ratio in ΔΣ divider 220. U.S. Pat. No. 6,856,791, issued Feb. 15, 2005 to Klemmer ("Klemmer"), the contents of which are hereby incorporated by reference, describes an AFC circuit for a mobile terminal employing a fractional-N PLL circuit to directly reduce errors in the synthesized frequency. A frequency error in the synthesized output frequency is detected by analyzing signals received from a base station, and a control signal is generated to adjust the fractional-N frequency divider ratio to compensate for the error. In the embodiment described by Klemmer, the frequency error is detected by observing the average speed of rotation of symbols in the received I/Q constellation; those skilled in the art are familiar with various techniques for detecting and measuring an error in a frequency source relative to a signal received from an external transmitter.

Figure 3:
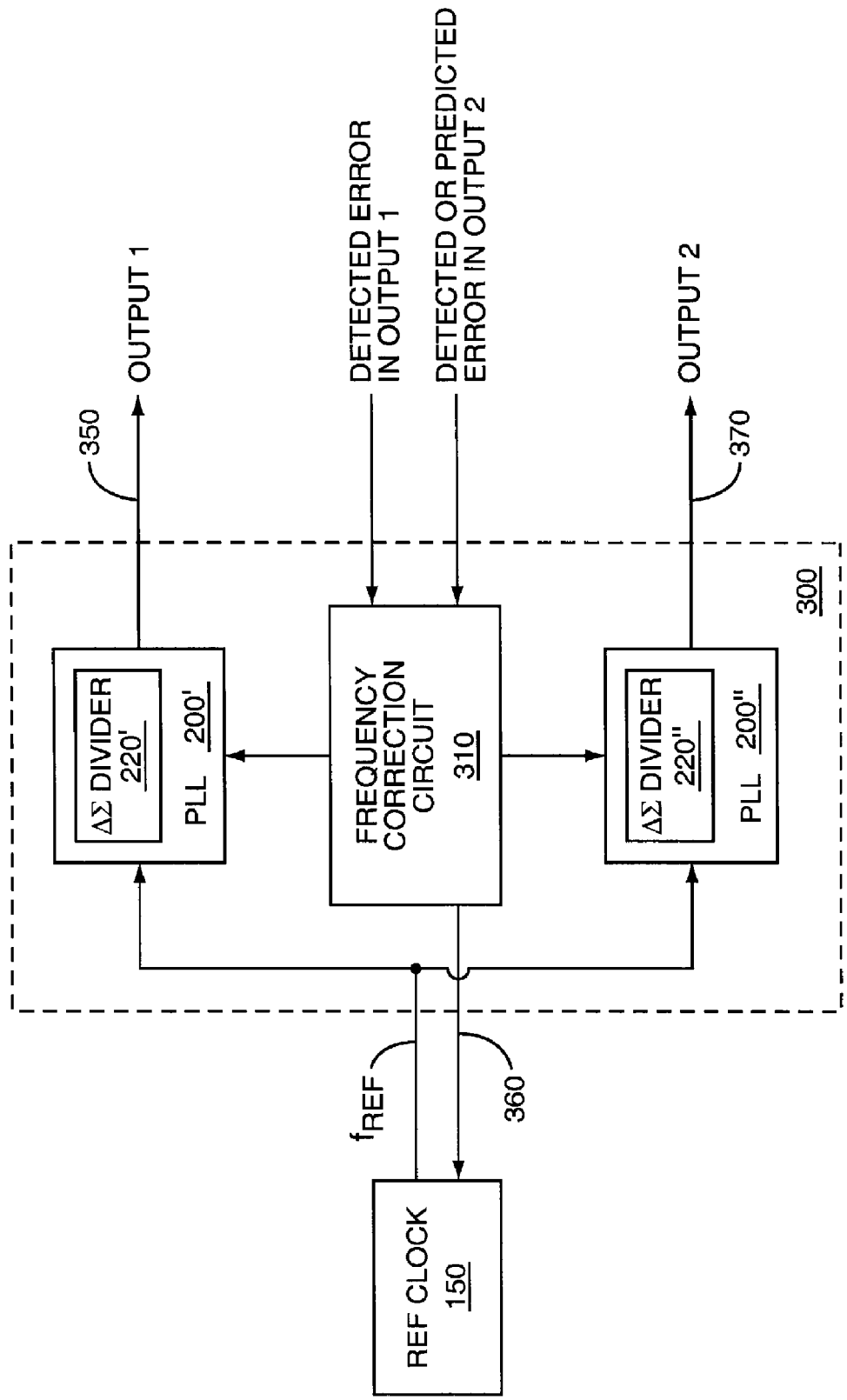
FIG. 3 illustrates functional blocks of a frequency synthesizer circuit in accordance with one or more embodiments of the invention.

Because frequency corrections applied at frequency divider 220 have no effect on the reference clock signal, these adjustments will likewise have no effect on other circuits that share the reference clock signal frequency. FIG. 3 illustrates a frequency synthesizer circuit 300 comprising two PLL circuits 200, identified in FIG. 3 as PLL 200' and PLL 200", each driven by a reference clock signal from reference clock 150. Frequency synthesizer circuit 300 further comprises a frequency correction circuit 310 which, responsive to at least a detected frequency error in one of the output signals, is configured to correct the frequency of the first output signal 350 by adjusting frequency divider 220' in PLL 200'. Frequency correction circuit 310 is further configured to generate a control signal 360 to adjust the frequency of reference clock 150. Furthermore, in the exemplary embodiment pictured in FIG. 3, frequency correction circuit is also configured to apply an adjustment to frequency divider 220" in PLL 200".

While frequency corrections applied to output signal 350 applied by adjusting frequency divider 220' have no effect on output signal 370 (from PLL 200"), adjustments to reference clock 150 directly influence output signal 370. Corrections to the frequency of a first signal, output signal 350, may thus be allocated between adjustments to the frequency-division ratio of divider 220' and adjustments to reference clock 150. The allocation may be based on a desired correction to the frequency of the second output, output signal 370. For instance, suppose that a frequency error in output signal 350 of +5 ppm has been detected. (A positive error may arbitrarily be defined to mean that output signal 350 is higher in frequency than desired.) Frequency correction circuit 310 may be configured to allocate 3 ppm of the resulting correction of that circuit to an adjustment of divider 220' in PLL 200'. Thus, the control signal setting the frequency-division ratio of divider 220' is adjusted so that the frequency of output signal 350 is reduced by 3 ppm (or 0.0003%) relative to the desired frequency. The frequency correction circuit 310 may then generate a control signal 360 to adjust the reference clock 150 to remove the remaining portion of the error. Note that, in some embodiments, frequency correction circuit 310 may calculate a control signal 360 to adjust reference clock 150, based on the desired adjustment. In others, conventional closed-loop techniques, based on the detected error, may be employed to generate an analog control signal 360 to adjust the reference clock to remove any frequency error not corrected by the adjustment to divider 220'.

The preceding examples may be further clarified with additional numerical details. Assume a reference clock frequency, $f_{REF}$, of 26.00 MHz, and a desired output frequency of 869.01 MHz. Further assume that a reference divider 260 is not used, or, alternatively, that R=1. Accordingly, the nominal divide ratio N must be set to approximately 33.423462. (In practice, of course, the divide ratio may be defined in a binary representation. Furthermore, the resolution may in a practical device be less than that implicit in this example.) Assume further that a frequency error of 4.0 kHz, is detected, by comparing the generated output signal 350 to a received signal. In other words, the actual output frequency is determined to be 869.014 MHz, rather than the desired frequency of 869.010 MHz. In relative terms, this error amounts to about 4.6 ppm. This frequency error may comprise error caused by Doppler shift, as well as error caused by temperature-related drift in reference clock 150. The error can be almost perfectly corrected by adjusting the frequency-division in divider 220' to a value N of 33.423308. In other words, the value of N is adjusted downward slightly, by 0.000154, resulting in an error of well under 0.1 ppm.

As previously noted, by applying AFC to the divider 220' alone, the frequency of output signal 370, which is also derived from reference clock 150, is unaffected. However, if a portion of the detected frequency error is corrected by adjusting the reference clock 150, then output signal 370 is also adjusted in the same proportion. For instance, in the example above, output signal 350 was determined to have an initial frequency error of about +4.6 ppm. It may be known, or estimated, that of this error, approximately +0.3 ppm is caused by Doppler shift, while the remaining +4.3 ppm is attributable to error in the reference clock 150. Output signal 350 may be corrected by allocating the adjustments between adjustments to the frequency-division ratio of divider 220' and to the reference clock 150, as described above. In this case, assuming that the portion of the error caused by the reference clock 150 was properly estimated, then output signal 370 will be corrected as a result of the adjustment to reference clock 150.

Those skilled in the art will immediately recognize that configuring frequency correction circuit 310 to apply independent adjustments to frequency divider 220' and reference clock 150 provides two degrees of freedom. Thus, output signal 350 and output signal 370 may be independently corrected or adjusted. These adjustments may be completely arbitrary, within range and resolution limits imposed by the detailed design of divider 220', the control circuit for generating control signal 360, and the frequency plan. Thus, adjustments may be allocated to frequency divider 220' and reference clock 150 based on a desired offset, so that the first and second output signal frequencies are corrected in different proportions.

A third degree of freedom may be obtained by configuring frequency correction circuit 310 to also apply an adjustment to frequency divider 220" in PLL 200". This may be useful, for instance, in certain situations where reference clock 150 is used by yet another circuit, such as an additional communications transceiver. If no adjustment to reference clock 150 is made, then a desired correction to output signal 370, such as to match all or part of the correction applied to output signal 350, may be calculated directly and applied to divider 220". On the other hand, if an adjustment to reference clock 150 is made, then the magnitude of that adjustment must be accounted for in predicting the adjustment to divider 220" that is required to achieve a desired adjustment or correction to output signal 370. For instance, in an earlier example, an error of +4.6 ppm was detected in output signal 350, and was corrected by adjusting frequency divider 220' to account for +0.3 ppm of the error and adjusting reference clock 150 to account for the remaining +4.3 ppm. (If +4.6 ppm corresponds to a positive error, as in the above example, then the reference clock frequency is adjusted downwards to compensate.) The frequency of output signal 370 is also affected by the adjustment to reference clock 150, and is thus lowered by a corresponding proportion. If a different adjustment to output signal 370 is desired, for instance to compensate for an independent source of frequency error, than an additional adjustment to frequency divider 220" may be applied. This independent source may be measured or detected, such as by comparing the output signal 370 to a received signal, or may be predicted, based on, for instance, the detected error in output signal 350 or knowledge of the operating characteristics of reference clock 150, or based on anticipated Doppler shift on a received signal, such as a satellite positioning signal from satellite 125. Accordingly, an adjustment to output signal 370 caused by the correction of reference clock 150 may be increased, by adding an offset, or further adjustment, to divider 220" that results in a frequency shift in the same direction. Alternatively, the overall adjustment may be reduced, by adding an adjustment shifting the frequency in the opposite direction, or even completely reversed, with a large enough adjustment to the frequency-division ratio of divider 220".

Thus, those skilled in the art will appreciate the flexibility and range of control facilitated by the circuit described above and its variants. Some applications may require only two control points, while others require three. Thus, frequency correction circuit 310 may be configured to adjust frequency divider 220' as well as reference clock 150 in some embodiments, or configured only to adjust frequency divider 220' as well as frequency divider 220" in others. For applications requiring three control points, frequency correction circuit 310 may be configured as pictured in FIG. 3, to adjust frequency dividers 220' and 220" as well as reference clock 150. Those skilled in the art will appreciate that further variations, including the use of additional PLL circuits 200 configured for further adjustments, are also possible.

Those skilled in the art will also appreciate that several of the functional elements of frequency synthesizer circuit 300 described above may be implemented on one or more microcontrollers or microprocessors, and may be implemented together or separately, with appropriate applications program interfaces between them. One or more of these elements may be implemented on control processor 160 or on a processor shared with cellular transceiver 110 or GPS receiver 120, for example. Alternatively, these elements may be implemented with a separate hardware device. Several functional blocks, such as reference divider 260 and $\Delta\Sigma$ divider 220, may be implemented using separate integrated circuits, or may be integrated as part of a digital or mixed-signal application-specific integrated circuit (ASIC). Phase detector 230, charge pump 240, and loop filter 250 may likewise comprise one or more separate integrated circuits or be integrated on an ASIC. In some embodiments, loop filter 250 may employ conventional analog components, but other embodiments may substitute all-digital designs for phase-locked loop 200. Similarly, VCO 210 may comprise a discrete analog circuit, or may be implemented on a digital or mixed-signal ASIC. Reference clock 150 typically comprises a crystal-based oscillator, which may be compensated or stabilized in various ways known to the art, but other sources of a reference clock signal may be used. Those skilled in the art will appreciate the cost, performance, and maintenance tradeoffs inherent in these design choices.

Figure 4:
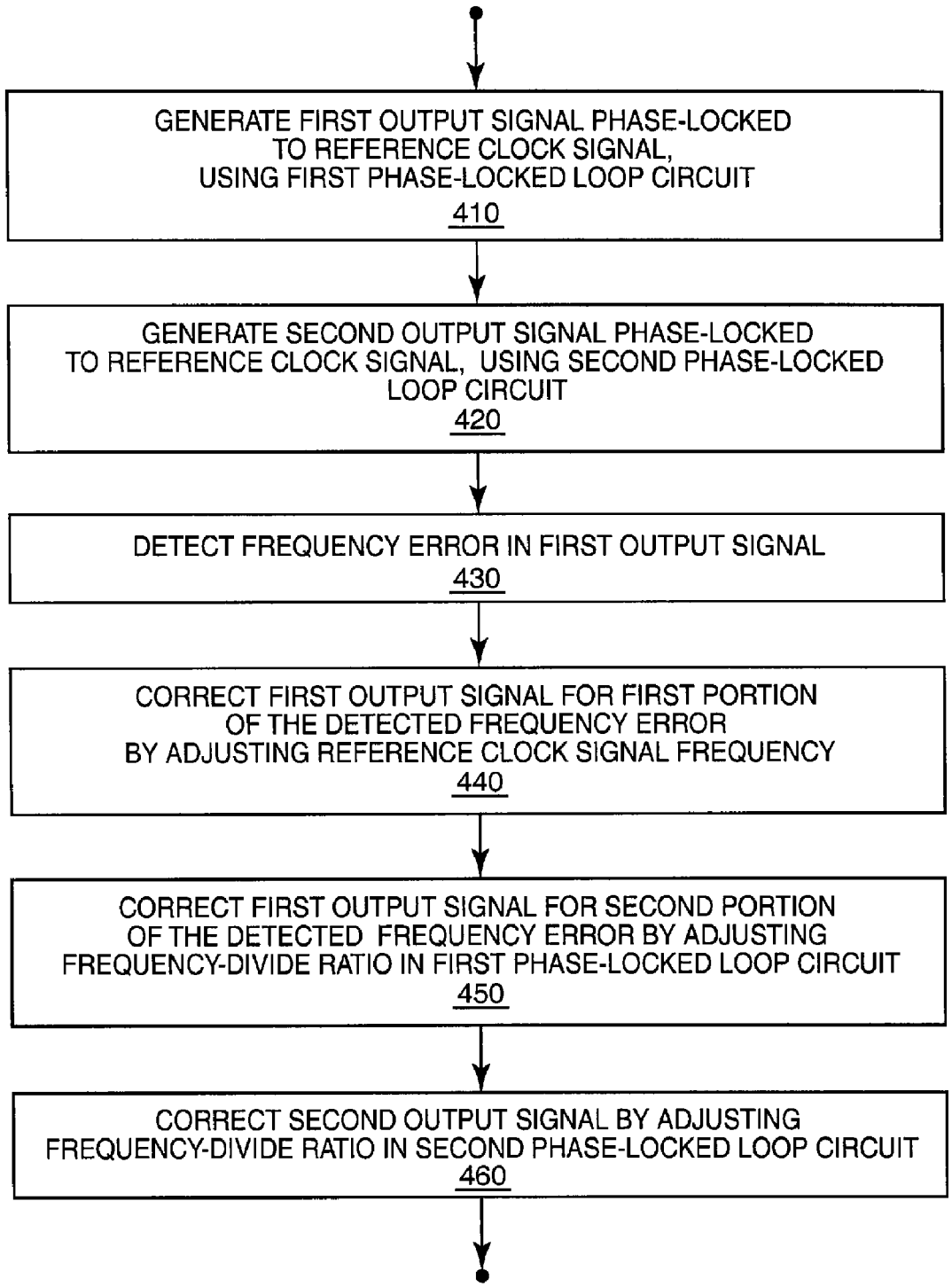
FIG. 4 is a flow diagram illustrating an exemplary method for generating multiple output signals phase-locked to a common reference clock signal and correcting those signals in response to a detected frequency error.

FIG. 4 is a flow diagram illustrating an exemplary method for synthesizing two or more output signals phase-locked to a reference clock signal, such as may be implemented using the frequency synthesizer circuit 300 illustrated in FIG. 3 or one of its variants. Although the method illustrated in FIG. 4 is described below in terms of the components pictured in FIG. 3, those skilled in the art will recognize that alternative circuit configurations and functionally equivalent components may be used in appropriate circumstances.

At block 410, a first output signal 350 is generated and phase-locked to a reference clock signal, using a first PLL circuit 200'. At block 420, a second output signal 370 is generated and phase-locked to the same reference clock signal, using a second PLL circuit 200". The operation of an exemplary PLL circuit 200 was described above, and is not repeated here.

At block 430, a frequency error in the first output signal 350 is detected. As discussed earlier, this frequency error may be detected by comparing the frequency of the output signal 350 to a signal received from a remote transmitter. In a wireless telecommunications system, for example, base station transmissions are typically generated from an extremely stable reference. Mobile station transmissions must generally be based on a frequency reference that is accurate to within 0.1 ppm or so. This is typically achieved using one or more well-known automatic frequency control (AFC) techniques. One such technique, as described above, involves measuring the average rate of rotation of an I/Q constellation derived from a received signal. Since the received signal is typically downconverted using the same or a related frequency reference as that used for generating transmit signals, the error detected from measuring the I/Q constellation rotation may be used to correct frequency error in the transmit local oscillator signal.

At block 440, frequency correction circuit 310 corrects for at least a first portion of the detected frequency error by adjusting the frequency of reference clock 150. As described above, frequency correction circuit 310 may calculate and generate a digital control signal, such as a tuning word, to adjust the frequency of reference clock 150. Alternatively, the detected error, if in digital form, may be converted to an analog signal used to adjust reference clock 150 via an analog control interface. This may be necessary, for instance, to control a varactor-based voltage-controlled crystal oscillator (VCXO). The control signal 360 generated to adjust reference clock 150 may be combined with other adjustments made to reference clock 150, such as temperature compensation, or may be applied separately.

As described above, the portion of the detected frequency error corrected by adjusting reference clock 150 may be selected arbitrarily. Alternatively, the correction of reference clock 150 may comprise correcting for a residual frequency error, after a second portion of the detected frequency error is corrected using the frequency-division ratio of divider 220'. Frequency correction circuit 310 may also be configured to allocate a portion of the frequency error correction to the reference clock adjustment based on a predicted or measured error attributable to clock-based error sources. For instance, frequency correction circuit 310 may be supplied with temperature data and configured to predict a frequency error component caused by temperature. This predicted error component may be allocated to the correction applied to the reference clock frequency.

In some embodiments, frequency correction circuit 310 may be configured to average multiple frequency error measurements over a predetermined interval of time, to determine an average frequency error. This may be particularly useful when the detected error is varying over seconds or minutes, perhaps due to variations in Doppler shift caused by changes in relative speed. Frequency correction circuit 310 may be configured to allocate this average error to the reference clock 150, and to adjust the reference clock frequency accordingly.

At block 450, a second portion of the detected frequency error in the first output signal 350 is corrected by adjusting the frequency-divide ratio in frequency divider 220'. This second portion of the detected frequency may comprise the remainder of the frequency error with respect to the first portion. Alternatively, frequency correction circuit 310 may be configured to under-correct or over-correct, depending on the specific application and the circumstances. Furthermore, this adjustment for the second portion of the frequency error may actually be applied first. For example, frequency correction circuit 310 may calculate a desired adjustment to be made via frequency divider 220', apply that adjustment, and then enable a closed-loop AFC circuit to remove residual frequency error by adjusting the reference clock frequency.

Finally, in the method pictured in FIG. 4, frequency correction circuit 310 corrects the second output signal 370 by adjusting a frequency-divide ratio in divider 220" in the second PLL circuit 200" at block 460. As noted above, this correction to the second output signal 370 may be based on a measured or predicted error in the second output signal, and will typically take into account any adjustment made to reference clock 150.

The method illustrated in FIG. 4 employs three adjustments (to divider 220', divider 220", and to reference clock 150) to correct two output signals 350 and 370. In other embodiments, output signals 350 and 370 may be controlled using only two of these 3 control points. For instance, adjustments may be allocated between divider 220' and reference clock 150, providing independent control of output signals 350 and 370. Similarly, adjustments may be independently applied to dividers 220' and 220".

The flexibility afforded by the described methods may be particularly useful in applications where operation of a receiver or transceiver function is sensitive to changes in the reference frequency. For example, a GPS receiver typically performs correlation operations to detect the received spread-spectrum signals. To achieve the desired sensitivity, these correlations may extend over hundreds of milliseconds. During these operations, changes in the reference signal frequency may disrupt the correlations, making the resulting measurements worthless. Thus, in certain embodiments of the invention, frequency correction circuit 310 may be configured to schedule adjustments applied to any or all of divider 220' or 220", or reference clock 150, to avoid frequency discontinuities (e.g., abrupt changes in frequency) in an output signal during a critical application-dependent time interval. This scheduling may be enforced by signals received from the application circuit, such as a signal that indicates that adjustments should be deferred. In certain embodiments, frequency correction circuit 310 may be supplied with information defining certain application-dependent time intervals from which a schedule for applying adjustments may be developed.

In some cases, this scheduling of adjustments may only temporarily affect how a particular correction is employed. Suppose, for instance, that a frequency error is detected in an output signal used in cellular transceiver 110. If an adjustment schedule prohibits adjustments that affect a second output signal, then the cellular signal may be corrected immediately by adjusting the corresponding frequency divider 220; this adjustment will have no effect on the second output signal. At a later time, when adjustments affecting the second output signal are no longer prohibited, then corrections to the first output signal may be reallocated by allocating all or a portion of the correction to an adjustment of reference clock 150.

In certain embodiments, relatively large adjustments to the reference clock 150 may be undesirable. In these embodiments frequency correction circuit 310 may be configured to gradually introduce an adjustment to the reference clock by successively allocating a desired correction to the first output signal 350 between frequency divider 220' and reference clock 150. These successive adjustments may be applied to the reference clock 150 and frequency divider 220' over a predetermined time interval so that a greater proportion of the overall correction of the detected frequency error is gradually shifted to the reference clock frequency adjustments. In some embodiments, these adjustments may be calculated to shift an increasing proportion of the total correction to the reference clock frequency adjustment at each successive adjustment. In other embodiments, the time interval need not be pre-determined. Rather, successive adjustments may be applied using a fixed step size, or a maximum step size, applied successively until the desired proportion of the error correction is shifted to the reference clock frequency adjustment.

Figure 5:
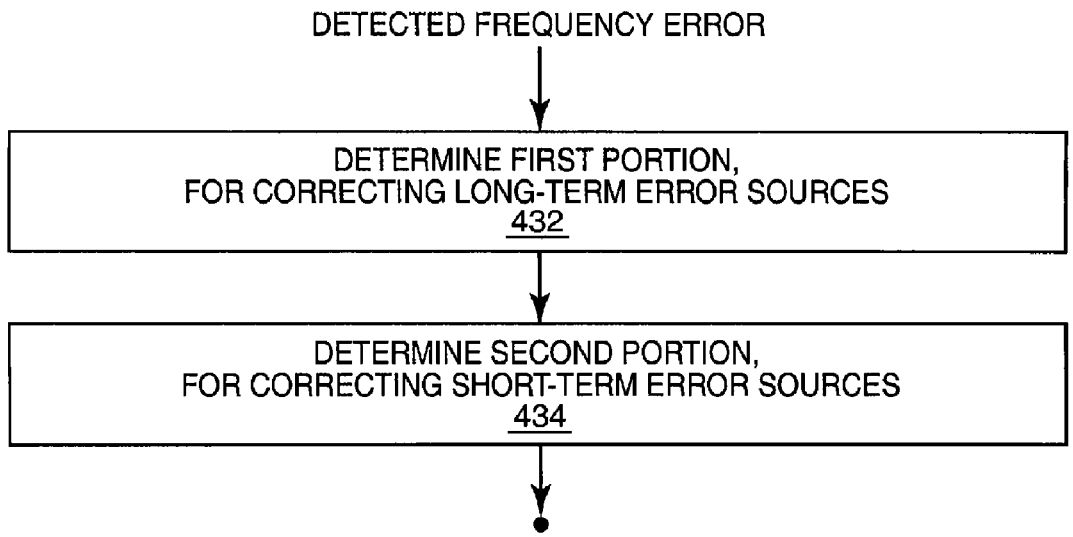
FIG. 5 is a flow diagram illustrating the determination of a first and second portion of a detected frequency error, in accordance with some embodiments of the present invention.

FIG. 5 is a flow diagram illustrating an exemplary method for allocating adjustments between frequency divider 220' and reference clock 150. In certain embodiments, this allocation may be combined with the method illustrated in FIG. 4, in which case these steps might be inserted between blocks 430 and 440. In any event, based on a detected frequency error, a first portion of the frequency error is determined at block 432, wherein the first portion corresponds to long-term error sources. These error sources may include, for example, fixed errors in the tuning of reference clock 150, slowly varying errors due to temperature effects on reference clock 150, or errors induced by a sagging voltage supplied from a battery near discharge. At block 434, a second portion of the detected frequency error, corresponding to short-term error sources, is determined. Short-term error may arise from Doppler shift, for example. Once these first and second portions of the detected frequency error have been determined, they may be used by frequency correction circuit 310 to allocate adjustments between, for example, divider 220' and reference clock 150, as was illustrated in FIG. 4.

Figure 6:
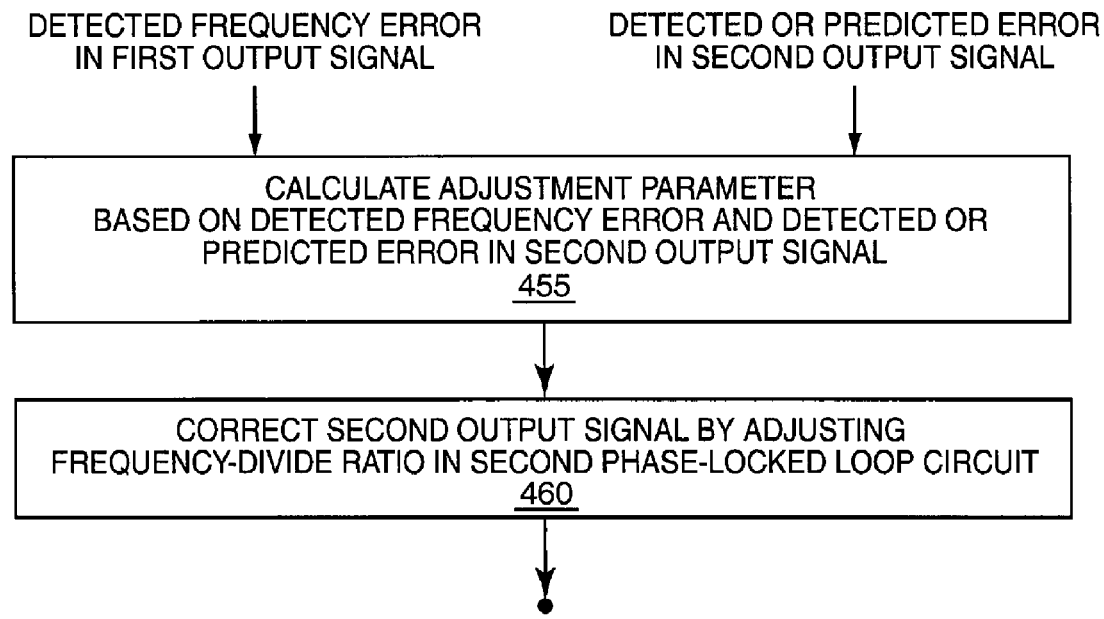
FIG. 6 is a flow diagram illustrating the correction of a second output signal based on a detected frequency error in a first output signal and a predicted error in the second output signal.

FIG. 6 illustrates in more detail the correction of a second output signal 370, based on a detected frequency error in the first output signal 350 and a predicted or detected error in second output signal 370. If it is known that all or part of the detected frequency error in the first output signal 350 is caused by a reference frequency error, for instance, then a corresponding error can be predicted for the second output signal 370. However, other sources may also contribute to a predicted error. In any case, at block 455, frequency correction circuit 310 calculates an adjustment parameter based on the detected frequency error in first output signal 350 and the detected or predicted error in second output signal 370. The predicted error may comprise, for example, an anticipated Doppler shift in a positioning signal received from a GPS receiver. The calculation of the adjustment parameter takes into account the error detected in the first output signal 350, either directly, or by accounting for corrections made to the first output signal 350 via adjustments made to the frequency divider 220' and/or reference clock 150. For instance, frequency correction circuit 310 might in some embodiments correct the first output signal 350 by adjusting only the frequency-divide ratio in divider 220'. In this case, frequency correction circuit 310 might calculate an adjustment parameter for use in correcting second output signal 370 based directly on the detected error. In another embodiment, at least a portion of the detected frequency error may be corrected in the first output signal 350 by adjusting reference clock 150, in which case the allocation of error, along with the detected frequency error, may be used in calculating the desired adjustment to the second output signal 370.

Those skilled in the art will appreciate, in view of the preceding discussion, the applicability of the methods and circuits described herein to a communications device, such as the multi-function communications device pictured in FIG. 1. Communications device 100 comprises a communications transceiver circuit, pictured in FIG. 1 as a cellular transceiver circuit 110, and a second receiver circuit, pictured in FIG. 1 as GPS receiver 120. Frequency synthesizer circuit 140 may correspond to frequency synthesizer circuit 300, pictured in FIG. 3, and comprise first and second phase-locked loop circuits 200' and 200" configured to generate first and second output signals 350 and 370, respectively, phase-locked to a common reference clock signal from reference clock 150. The first output signal is used by the communications transceiver circuit 110 and the second output signal is used by the second receiver circuit 120.

Frequency synthesizer circuit 140 may further comprise a frequency correction circuit 310. The frequency correction circuit 310 is configured to correct the first output signal by adjusting a first frequency-division ratio in the first phase-locked loop circuit 200' and generating a control signal to adjust the frequency of the reference clock signal, in response to a frequency error in the first output signal detected by the communications transceiver circuit 110. In some embodiments, the frequency correction circuit 310 may be further configured to calculate an adjustment parameter based on the detected frequency error and the adjustment to the reference clock frequency, and to correct the second output signal by adjusting a second frequency-division ratio in the second phase-locked loop circuit 200", using the adjustment parameter. In some embodiments, frequency correction circuit 310 may be configured to schedule adjustments to any or all of the phase-locked loop circuits 200' or 200" or the reference clock 150, to avoid frequency discontinuities during one or more satellite signal measurements made by the satellite positioning receiver circuit.

Those skilled in the art will appreciate that the foregoing description and the accompanying drawings represent non-limiting examples of the methods and apparatus taught herein for synthesizing multiple signals phase-locked to a common reference. Accordingly, the present invention is limited only by the following claims and their legal equivalents.

What is claimed is:

1. A frequency synthesizer circuit, comprising:
   a first phase-locked loop circuit configured to generate a first output signal phase-locked to a reference clock signal;
   a second phase-locked loop circuit configured to generate a second output signal phase-locked to the same reference clock signal; and
   a frequency correction circuit configured to correct the first output signal by adjusting a first frequency-division ratio in the first phase-locked loop circuit and generating a control signal to adjust the frequency of the reference clock signal, in response to a detected frequency error in the first output signal.

2. The frequency synthesizer circuit of claim 1, wherein the frequency correction circuit is configured to generate the control signal to correct for one or more relatively long-term sources for the detected frequency error and to determine the adjustment of the first frequency-division ratio to correct for one or more relatively short-term sources.

3. The frequency synthesizer circuit of claim 2, wherein the frequency correction circuit is configured to determine the adjustment of the first frequency-division ratio based on a Doppler shift resulting from motion of the frequency synthesizer circuit relative to a remote transmitter.

4. The frequency synthesizer circuit of claim 2, wherein the frequency correction circuit is configured to generate the control signal based on a reference frequency error in the reference clock signal.

5. The frequency synthesizer circuit of claim 2, wherein the frequency correction circuit is configured to generate the control signal based on an average of the detected frequency error over an averaging interval and to determine the adjustment of the first frequency-division ratio based on the difference between the average and the detected frequency error.

6. The frequency synthesizer circuit of claim 1, wherein the frequency correction circuit is further configured to calculate an adjustment parameter based on the detected frequency error and the adjustment to the reference clock frequency, and to correct the second output signal by adjusting a second frequency-division ratio in the second phase-locked loop circuit, using the adjustment parameter.

7. The frequency synthesizer circuit of claim 1, wherein the frequency correction circuit is configured to schedule the adjustments of the reference clock signal frequency and the first frequency-division ratio to avoid frequency discontinuities in the first or second output signals, or both, during one or more application-dependent time intervals.

8. The frequency synthesizer circuit of claim 1, wherein the frequency correction circuit is configured to apply successive adjustments to the reference clock signal frequency and the first frequency-division ratio to shift, over time, a greater proportion of the overall correction of the detected frequency error to the adjustments of the reference clock signal frequency.

9. A frequency synthesizer circuit, comprising:
   a first phase-locked loop circuit configured to generate a first output signal phase-locked to a reference clock signal;

a second phase-locked loop circuit configured to generate a second output signal phase-locked to the same reference clock signal; and a frequency correction circuit configured to:
correct the first output signal by adjusting a first frequency-division ratio in the first phase-locked loop circuit in response to a detected frequency error in the first output signal;
calculate an adjustment parameter based on the detected frequency error; and
correct the second output signal by adjusting a second frequency-division ratio in the second phase-locked loop circuit, using the adjustment parameter.

10. The frequency synthesizer circuit of claim 9, wherein the frequency correction circuit is configured to calculate the adjustment parameter based on an offset, so that the first and second output signal frequencies are corrected in different proportions.

11. The frequency synthesizer circuit of claim 10, wherein the frequency correction circuit is configured to determine the offset based on a detected error in the second output signal.

12. The frequency synthesizer circuit of claim 10, wherein the frequency correction circuit is configured to determine the offset based on a predicted error in the second output signal.

13. The frequency synthesizer circuit of claim 9, wherein the frequency correction circuit is configured to schedule the adjustments of the first and second frequency-division ratios to avoid frequency discontinuities in the first or second output signals, or both, during one or more application-dependent time intervals.

14. A method for synthesizing two or more output signals from a reference clock signal, comprising:
generating a first output signal phase-locked to the reference clock signal, using a first phase-locked loop circuit;
generating a second output signal phase-locked to the reference clock signal, using a second phase-locked loop circuit;
correcting the first output signal by adjusting a first frequency-division ratio in the first phase-locked loop circuit and generating a control signal to adjust the frequency of the reference clock signal, in response to detected frequency error in the first output signal.

15. The method of claim 14, wherein adjusting a first frequency-division ratio in the first phase-locked loop circuit comprises adjusting the first frequency-division ratio based on a Doppler shift resulting from motion relative to a remote transmitter.

16. The method of claim 14, wherein generating the control signal comprises generating the control signal based on a reference frequency error in the reference clock signal.

17. The method of claim 14, wherein generating the control signal comprises generating the control signal based on an average of the detected frequency error obtained over an averaging interval and wherein adjusting a first frequency-division ratio in the first phase-locked loop circuit comprises adjusting the first frequency-division ratio based on the difference between the average of the detected frequency error and the detected frequency error.

18. The method of claim 14, further comprising calculating an adjustment parameter based on the detected frequency error in the first output signal and the adjustment to the reference clock frequency, and correcting the second output signal by adjusting a second frequency-division ratio in the second phase-locked loop circuit, using the adjustment parameter.

19. The method of claim 14, further comprising scheduling the adjustments of the reference clock signal frequency and the first frequency-division ratio to avoid frequency discontinuities in the first or second output signals, or both, during one or more application-dependent time intervals.

20. A method for synthesizing two or more output signals from a reference clock signal, comprising:
generating a first output signal phase-locked to the reference clock signal, using a first phase-locked loop circuit;
generating a second output signal phase-locked to the reference clock signal, using a second phase-locked loop circuit;
correcting the first output signal by adjusting a first frequency-division ratio in the first phase-locked loop circuit in response to detected frequency error in the first output signal;
calculating an adjustment parameter based on the detected frequency error; and
correcting the second output signal separately from the correction to the first output signal by adjusting a second frequency-division ratio in the second phase-locked loop circuit, using the adjustment parameter.

21. The method of claim 20, wherein calculating an adjustment parameter based on the detected frequency error comprises calculating the adjustment parameter based on an offset, so that the first and second output signal frequencies are corrected in different proportions.

22. The method of claim 20, further comprising scheduling the adjustments of the first and second frequency-division ratios to avoid frequency discontinuities in the first or second output signals, or both, during one or more application-dependent time intervals.

23. A communications device, comprising
a communications transceiver circuit;
a second receiver circuit;
a first phase-locked loop circuit configured to generate a first output signal phase-locked to a reference clock signal, for use by the communications transceiver;
a second phase-locked loop circuit configured to generate a second output signal phase-locked to the same reference clock signal, for use by the second receiver circuit; and
a frequency correction circuit configured to correct the first output signal by adjusting a first frequency-division ratio in the first phase-locked loop circuit and generating a control signal to adjust the frequency of the reference clock signal, in response to a frequency error in the first output signal detected by the communications transceiver circuit.

24. The communications device of claim 23, wherein the frequency correction circuit is further configured to calculate an adjustment parameter based on the detected frequency error and the adjustment to the reference clock frequency, and to correct the second output signal by adjusting a second frequency-division ratio in the second phase-locked loop circuit, using the adjustment parameter.

25. The communications device of claim 23, wherein the frequency correction circuit is configured to schedule the adjustments of the reference clock signal frequency and the first frequency-division ratio to avoid frequency discontinuities in the first or second output signals, or both, during one or more application-dependent time intervals.

* * * * *